United States Patent
Kim et al.

(10) Patent No.: US 9,269,776 B2
(45) Date of Patent: Feb. 23, 2016

(54) SEMICONDUCTOR DEVICE AND METHOD FOR GROWING SEMICONDUCTOR CRYSTAL

(75) Inventors: Moo Seong Kim, Seoul (KR); Yeong Deuk Jo, Seoul (KR); Chang Hyun Son, Seoul (KR); Bum Sup Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/981,750

(22) PCT Filed: Jan. 20, 2012

(86) PCT No.: PCT/KR2012/000571
§ 371 (c)(1),
(2), (4) Date: Nov. 15, 2013

(87) PCT Pub. No.: WO2012/102539
PCT Pub. Date: Aug. 2, 2012

(65) Prior Publication Data
US 2014/0054610 A1 Feb. 27, 2014

(30) Foreign Application Priority Data

Jan. 25, 2011 (KR) .................. 10-2011-0007518
Feb. 8, 2011 (KR) .................. 10-2011-0010962

(51) Int. Cl.
*H01L 31/0312* (2006.01)
*H01L 29/16* (2006.01)
*H01L 21/02* (2006.01)

(52) U.S. Cl.
CPC ........ *H01L 29/1608* (2013.01); *H01L 21/0243* (2013.01); *H01L 21/0262* (2013.01);
(Continued)

(58) Field of Classification Search
CPC .................... H01L 27/124; H01L 27/1259
See application file for complete search history.

(56) References Cited

U.S. PATENT DOCUMENTS

| 5,443,032 A | 8/1995 | Vichr et al. |
| 7,683,386 B2 * | 3/2010 | Tanaka et al. .................. 257/88 |

(Continued)

FOREIGN PATENT DOCUMENTS

| CN | 1429401 A | 7/2003 |
| CN | 101510504 A | 8/2009 |

(Continued)

OTHER PUBLICATIONS

Supplementary European Search Report in European Application No. 12739653.9, dated Jun. 25, 2014.

(Continued)

*Primary Examiner* — Matthew Smith
*Assistant Examiner* — Sarah Salerno
(74) *Attorney, Agent, or Firm* — Saliwanchik, Lloyd & Eisenschenk

(57) ABSTRACT

A semiconductor device comprises a base substrate, a pattern on the base substrate, a buffer layer on the base substrate, and an epitaxial layer on the buffer. The pattern is a self-assembled pattern. A method for growing a semiconductor crystal comprises cleaning a silicon carbide substrate, forming a self-assembled pattern on the silicon carbide substrate, forming a buffer layer on the silicon carbide substrate, and forming an epitaxial layer on the buffer layer. A semiconductor device comprises a base substrate comprising a pattern groove and an epitaxial layer on the base substrate. A method for growing a semiconductor crystal comprises cleaning a silicon carbide substrate, forming a self-assembled projection on the silicon carbide substrate, forming a pattern groove in the silicon carbide, and forming an epitaxial layer on the silicon carbide.

16 Claims, 3 Drawing Sheets

(52) U.S. Cl.
CPC .... *H01L21/02378* (2013.01); *H01L 21/02447* (2013.01); *H01L 21/02529* (2013.01); *H01L 21/02617* (2013.01); *H01L 21/02634* (2013.01); *H01L 21/02639* (2013.01); *H01L 21/02647* (2013.01); *H01L 21/02658* (2013.01)

(56) References Cited

U.S. PATENT DOCUMENTS

| | | | |
|---|---|---|---|
| 7,981,714 | B2 | 7/2011 | Kim et al. |
| 2003/0134446 | A1 | 7/2003 | Koike et al. |
| 2006/0169987 | A1* | 8/2006 | Miura et al. .................. 257/79 |
| 2006/0270201 | A1 | 11/2006 | Chua et al. |
| 2007/0001175 | A1* | 1/2007 | Kojima et al. ................ 257/77 |
| 2008/0258131 | A1 | 10/2008 | Kim |
| 2010/0155740 | A1 | 6/2010 | Chinone et al. |
| 2011/0049532 | A1* | 3/2011 | Odekirk et al. ............... 257/77 |
| 2011/0140127 | A1* | 6/2011 | Son et al. ..................... 257/77 |

FOREIGN PATENT DOCUMENTS

| | | |
|---|---|---|
| JP | H06183892 A | 7/1994 |
| JP | 2000-012509 A | 1/2000 |
| JP | 2004-235170 A | 8/2004 |
| JP | 2005-129629 A | 5/2005 |
| JP | 2008-094700 A | 4/2008 |
| JP | 2009-147246 A | 7/2009 |
| JP | 2009-536606 A | 10/2009 |
| JP | 2010-118616 A | 5/2010 |
| KR | 10-2006-0038059 A | 5/2006 |
| KR | 10-2008-0006207 A | 1/2008 |
| KR | 10-2008-0114049 A | 12/2008 |
| KR | 10-2009-0102338 A | 9/2009 |
| WO | WO-2005-074048 A1 | 8/2005 |
| WO | WO-2009-002073 A1 | 12/2008 |

OTHER PUBLICATIONS

Lu, P., "The influence of the $H_2$/Ar ration on surface morphology and structural defects in homoepitaxial $4H$-SiC films grown with methyltrichlorosilane." Journal of Applied Physics, pp. 1-5, Mar. 9, 2007.

Kojima, K., "Investigation of in-grown dislocations in 4H-SiC epitaxial layers." Materials Science Forum, vols. 527-529, pp. 147-154, Oct. 15, 2006.

International Search Report in International Application No. PCT/KR2012/000571, filed Jan. 20, 2012.

Office Action dated Jun. 3, 2015 in Chinese Application No. 201280015140.5.

Office Action dated Oct. 20, 2015 in Japanese Application No. 2013-551899.

Masato Ebihara, Nucleation and Growth Mode of GaN on Vicinal SiC Surfaces, Japanese Journal of Applied Physics, vol. 46, No. 15, Apr. 6, 2007, pp. 1348-1351, Japan.

Masataka Moriya, Self-Organized Microcones Grown on Si Substrate by Microwave Plasma Chemical Vapor Deposition, Japanese Journal of Applied Physics, vol. 47, No. 4, Apr. 25, 2008, pp. 3050-3052, Japan.

Satoru Tanaka, Ordering distance of self-ordered surface nano-facets on SiC Dept. of Applied Quantum Physics and Nuclear Engineering, The Physical Society of Japan, Meeting abstracts of the Physical Society of Japan 62(2-4), 913, Aug. 21, 2007.

* cited by examiner

SEMICONDUCTOR DEVICE AND METHOD FOR GROWING SEMICONDUCTOR CRYSTAL

CROSS-REFERENCE TO RELATED APPLICATIONS

This application is the U.S. national stage application of International Patent Application No. PCT/KR2012/000571, filed Jan. 20, 2012, which claims priority to Korean Application Nos. 10-2011-0007518, filed Jan. 25, 2011, and 10-2011-0010962, filed Feb. 8, 2011, the disclosures of each of which are incorporated herein by reference in their entirety.

TECHNICAL FIELD

The present disclosure relates to a semiconductor device and a method for growing a semiconductor crystal.

BACKGROUND ART

In a semiconductor substrate supporting a semiconductor device, the greatest research projects for improving efficiency and properties of the semiconductor device are to reduce crystal defects of a semiconductor layer grown on the substrate and improve crystalline of the semiconductor layer.

A buffer layer may be formed to reduce dislocation defects in a crystal growth process. To form the buffer layer, a process of forming a pattern on a surface of the substrate through a mask formation process and an etching process or a regrowth process may be further required.

Thus, due to the additional process, the manufacturing process may be complicated, and the manufacturing costs may be increased. In addition, the substrate surface may be deteriorated in quality.

DISCLOSURE OF INVENTION

Technical Problem

Embodiments provide a semiconductor device in which process costs is reduced and a substrate surface is improved in quality and a method for growing a semiconductor crystal having high efficiency.

Solution to Problem

In one embodiment, a semiconductor device comprises: a base substrate; a pattern on the base substrate; a buffer layer on the base substrate; and an epitaxial layer on the buffer, wherein the pattern is a self-assembled pattern.

In another embodiment, a method for growing a semiconductor crystal comprises: cleaning a silicon carbide substrate; forming a self-assembled pattern on the silicon carbide substrate; forming a buffer layer on the silicon carbide substrate; and forming an epitaxial layer on the buffer layer.

In further another embodiment, a semiconductor device comprises: a base substrate comprising a pattern groove; and an epitaxial layer on the base substrate.

In still further another embodiment, a method for growing a semiconductor crystal comprises: cleaning a silicon carbide substrate; forming a self-assembled projection on the silicon carbide substrate; forming a pattern groove in the silicon carbide; and forming an epitaxial layer on the silicon carbide.

Advantageous Effects of Invention

In the semiconductor device according to the first embodiment, the self-assembled fine pattern may be formed on the silicon carbide substrate, and also the buffer layer for restricting the dislocation defect using the fine pattern may be formed on the silicon carbide substrate. Thus, the additional process such as the patterning process or the regrowth process may be omitted to reduce the process costs.

In the method for growing the semiconductor crystal according to the first embodiment, the damage of the substrate surface due to the additional process for forming the buffer layer may be reduced to improve the crystalline of the semiconductor layer. Therefore, the high-quality semiconductor layer capable of securing reliability may be formed.

In the semiconductor device according to the second embodiment, the pattern groove may be formed in the silicon carbide substrate, and thus the dislocation defect of the epitaxial layer formed on the pattern groove may be restricted through the pattern groove.

Specifically, the basal plane dislocation (BPD) of the silicon carbide substrate may greatly affect the reliability of the semiconductor device. Thus, the pattern groove may be formed to reduce the BPD to about 50%. A portion of the BPD may be converted into the treading edge dislocation (TED) through the pattern groove, and the other portion of the BPD may be expanded and then terminated by meeting the silicon carbide substrate.

Thus, it may be unnecessary to additionally form the buffer layer for restricting the dislocation defect. As a result, the additional process such as the patterning process or the regrowth process for forming the buffer layer may be omitted. Therefore, the process cost and time may be reduced.

In the method for growing the semiconductor crystal according to the second embodiment, the damage of the substrate surface due to the additional process for forming the buffer layer may be reduced to improve the crystalline of the semiconductor layer. Therefore, the high-quality semiconductor layer capable of securing reliability may be formed.

MODE FOR THE INVENTION

Figure 1:
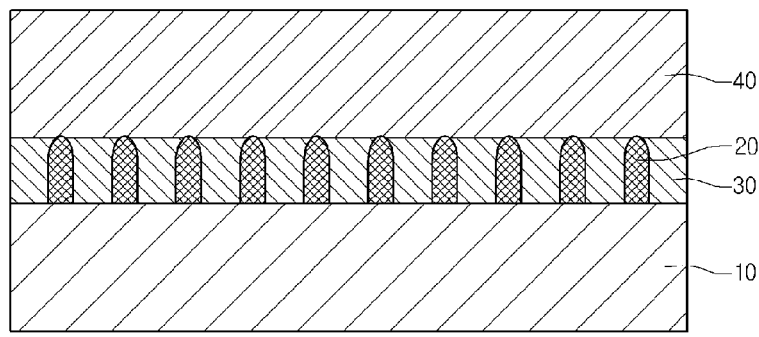
FIG. 1 is a sectional view of a semiconductor device according to a first embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the dimensions and size of each layer (or film), region, pattern or structure may be exaggerated, omitted, or schematically illustrated for convenience in description and clarity.

Hereinafter, exemplary embodiments will be described in detail with reference to the accompanying drawings.

A semiconductor device according to a first embodiment will be described in detail with reference to FIG. 1. FIG. 1 is a sectional view of a semiconductor device according to a first embodiment.

Referring to FIG. 1, a semiconductor device 1 according to a first embodiment may include a pattern 20, a buffer layer 30, and an epitaxial layer 40 on a base substrate 10.

The base substrate 10 may be formed of silicon carbide. The silicon carbide has a band gap and thermal conductivity greater than those of silicon. Also, the silicon carbide has carrier mobility similar to that of the silicon and a saturated electron drift velocity and pressure resistance greater than those of the silicon. Thus, the silicon carbide may be applied to a semiconductor device for which high efficiency, high pressure resistance, and high capacity are required.

The self-assembled pattern 20 is grown on the base substrate 10. The self-assembly represents a phenomenon in which components of molecules voluntarily form a well-ordered structure without artificially manipulating the respective molecules. When the base substrate 10 containing the silicon carbide is exposed to a carbon compound gas, the self-assembled pattern 20 having a nano scale is grown by reaction of the carbons.

Since the pattern 20 is self-assembled from the base substrate 10, the pattern 20 may be formed of silicon carbide that is the same material as that of the base substrate 10. The pattern 20 may vertically protrude from the base substrate 10. For example, the pattern 20 may have an elliptical cone shape.

The pattern 20 having the elliptical cone may have a long axis diameter of about 10 nm to about 30 nm and a height of about 100 nm or less. When the long axis of the pattern 20 has a diameter of about 30 or more, the patterns 20 adjacent to each other may lump together. Thus, when the long axis of the pattern 20 has a diameter of about 10 nm to about 30 nm, the self-assembly atmosphere may be removed to restrict a size of the pattern 20.

Sequentially, the buffer layer 30 is disposed on the base substrate 10. The buffer layer 30 may restrain dislocation defects of the epitaxial layer 40 that is a semiconductor layer disposed on the buffer layer 30. That is, the buffer layer 30 may be formed of the same material as the epitaxial layer 40. Thus, the buffer layer 30 may prevent a crystal defect due to a lattice constant mismatch and thermal expansion coefficient difference between the base substrate 10 and the epitaxial layer 40 from occurring.

In the current embodiment, the buffer layer 30 may be formed through an epitaxial lateral over growth (ELOG) process. The ELOG process may include a metal organic chemical vapor deposition (MOCVD) process or a molecular bean epitaxy (MBE) process. The MOCVD process is a process in which metal organic compound vapor having a high vapor pressure is injected onto a heated surface of the substrate within a chamber to grow a thin film. Thus, the MOCVD process may have an advantage in which a process time can be reduced due to a speed deposition rate. The MBE process is a process in which various growth materials having molecular forms are injected to grow a desired material on the substrate. Thus, the MBE process may have an advantage in which the buffer layer 30 has superior quality even though a growth rate is slow. However, the present disclosure is not limited thereto. For example, the buffer layer 30 may be grown through various growth processes.

The buffer layer 30 may be laterally grown between the patterns 20. Thus, the buffer layer 30 may be horizontally grown on only one surface of the base substrate 10 exposed between the patterns 20 to fill a space between the patterns 20.

Since the buffer layer 30 is horizontally grown, a defect due to vertical growth may be significantly reduced, unlike the growth method according to the related art.

Thus, in the growth of the buffer layer 30, an additional patterning process such as an etching process or an additional regrowth process may be omitted. In addition, process costs may be reduced, and quality of the substrate surface may be improved.

The semiconductor device according to the current embodiment may be applied to all of a vertical-type semiconductor device and a lateral-type semiconductor device to provide a high-quality epitaxial layer, thereby realizing a semiconductor device having high efficiency.

Hereinafter, a method for growing the semiconductor crystal according to the first embodiment will be described in detail with reference to FIGS. 2 to 7. For clear and simplified description, detailed descriptions of the previously described contents will be omitted.

Figure 2:
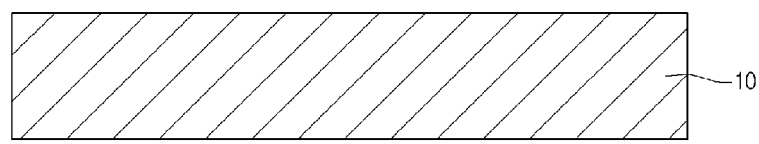
FIGS. 2 to 7 are sectional views for explaining a method for growing a semiconductor crystal according to the first embodiment.
Figure 3:
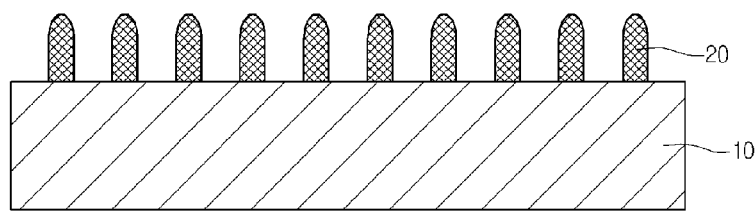

FIGS. 2 to 7 are sectional views for explaining a method for growing a semiconductor crystal according to the first embodiment. Referring to FIGS. 2 and 3, a silicon carbide substrate 10 is cleaned within a first chamber (not shown). Here, the first chamber has a gas atmosphere containing one gas of carbon compound gases such as methane, ethane, propane, fluoromethane, and hydrofluorocarbon therein.

Also, the first chamber is maintained at a humidity of about 30% or more therein. If the first chamber is maintained under a relatively dry atmosphere having a humidity less than that of about 30%, a self-assembled pattern 20 may be scattered in shape or does not have the long axis diameter of about 10 nm to about 30 nm and a height of about 100 nm or less. The pattern 20 having the above-described shape may be formed by being maintained for about 20 minutes to 30 minutes in a self-assembly process.

Figure 4:
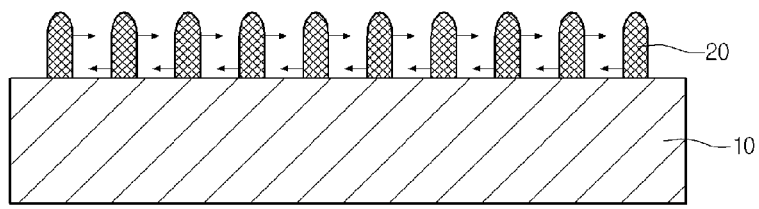
Figure 5:
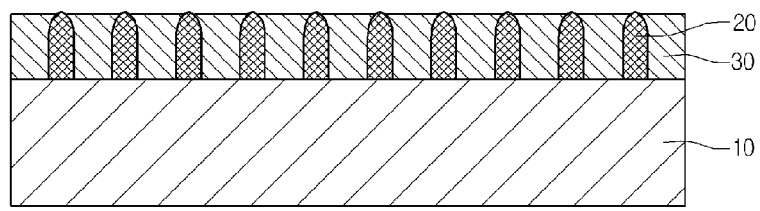

Referring to FIGS. 4 and 5, a buffer layer 30 is formed within a second chamber (not shown) through a lateral growth method. That is, the buffer layer 30 may be laterally grown in an arrow direction to fill a space between patterns 20. Here, the buffer layer 30 may be formed within the second chamber under a temperature of about 1600° C. or more under a gas atmosphere containing ethane, methane, propane, and a hydrogen gas.

Figure 6:
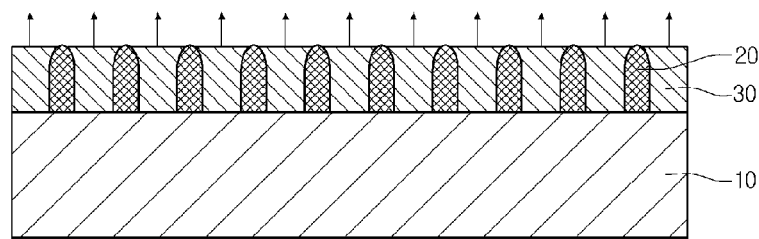
Figure 7:
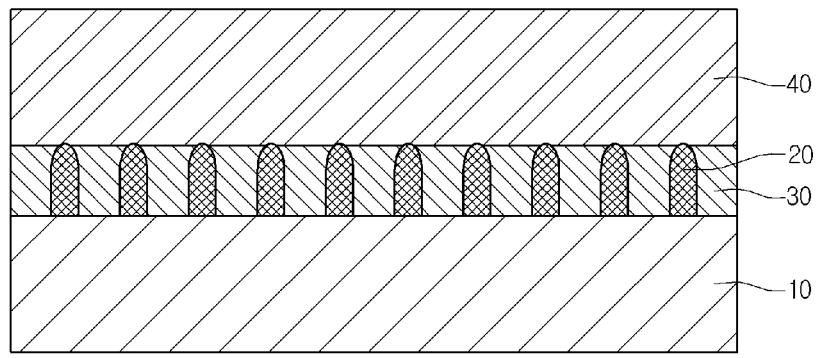

Referring to FIGS. 6 and 7, an epitaxial layer 40 is formed within the second chamber through an epitaxial growth method. That is, the epitaxial layer 40 may be vertically grown in an arrow direction to a high-quality epitaxial layer 40 having good crystalline and low defect density. Here, the epitaxial layer 40 may be continuously grown within the second chamber having the same atmosphere as that for forming the buffer layer 30.

Although not shown, impurities may be injected into the epitaxial layer 40 form a channel region (not shown).

The epitaxial layer 40 is formed through an epitaxial growth method. The epitaxial growth method is a method in which a new layer is stacked on a single crystal substrate to form a single crystal layer. Here, when the stacked material is equal to the material of the substrate, the epitaxial growth method may be called a homoepitaxy method. In the current embodiment, the epitaxial growth method may be the homoepitaxy method in which the epitaxial layer 40 having the same material as the buffer layer 30 is formed on the buffer layer 30 formed of silicon carbide.

When the atmosphere for forming the buffer layer 30 is maintained during the growth of the epitaxial layer 40, the buffer layer 30 may be vertically crystal-grown to form a thick crystal. Since the epitaxial layer 40 is formed of the silicon carbide that is the same material as that of the silicon carbide substrate 10, the quality of the crystal may be improved. Also, since the propagated dislocations are reduced through the buffer layer 30, a leaking current due to the crystal defect may be significantly reduced.

Although not shown in FIG. 7, a thick film semiconductor growth layer may be further formed on the epitaxial layer 40.

Figure 8:
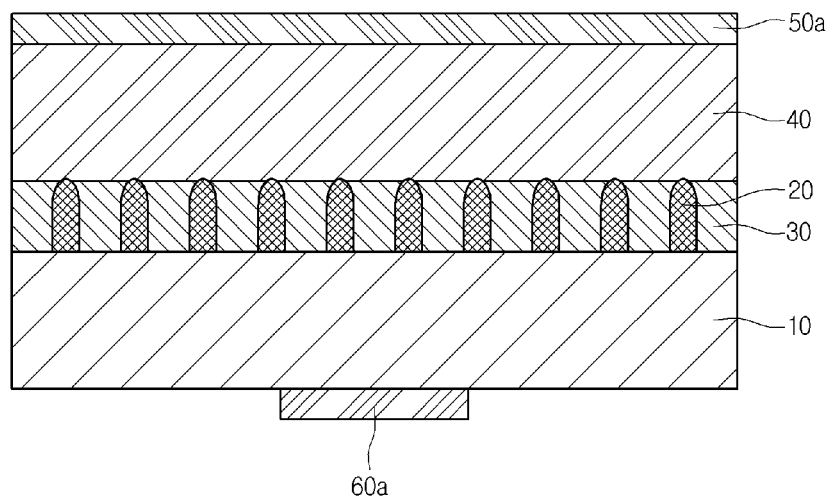
FIGS. 8 and 9 are sectional views of the semiconductor device according to the first embodiment.
Figure 9:
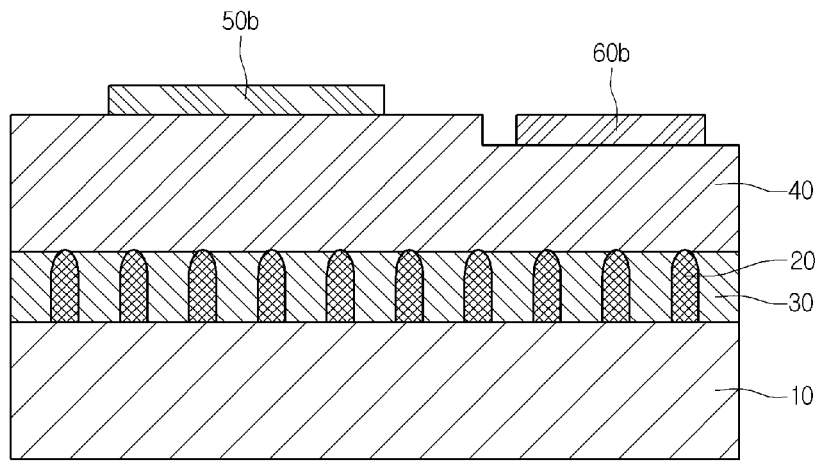

Hereinafter, structures of a vertical-type semiconductor device and a lateral-type semiconductor device will be described with reference to FIGS. 8 and 9. FIGS. 8 and 9 are sectional views of the semiconductor device according to the first embodiment.

Referring to FIG. 8, electrodes 50*a* and 60*a* may be disposed on a bottom surface of the substrate 10 and a top surface of the epitaxial layer 40.

Each of the electrodes 50*a* and 60*a* may be formed of at least one of metal materials such as Ag, Cu, Ni, Al, and Zn and alloys thereof. Also, each of the electrodes 50*a* and 60*a* may be manufactured through vacuum deposition.

FIG. 9 is a sectional view illustrating a structure of a lateral-type semiconductor device.

As shown in FIGS. 2 to 7, the pattern 20, the buffer layer 30, and the epitaxial layer 40 having minimized defects are disposed on the silicon carbide substrate 10. Also, as shown in FIG. 9, the electrodes 50*a* and 60*b* are disposed. Each of the electrodes 50*a* and 60*b* has a horizontal structure arranged almost parallel to the top surface of the epitaxial layer 40.

However, since the current embodiment is not limited thereto, the semiconductor crystal growth method may be applied to various semiconductor devices.

Figure 10:
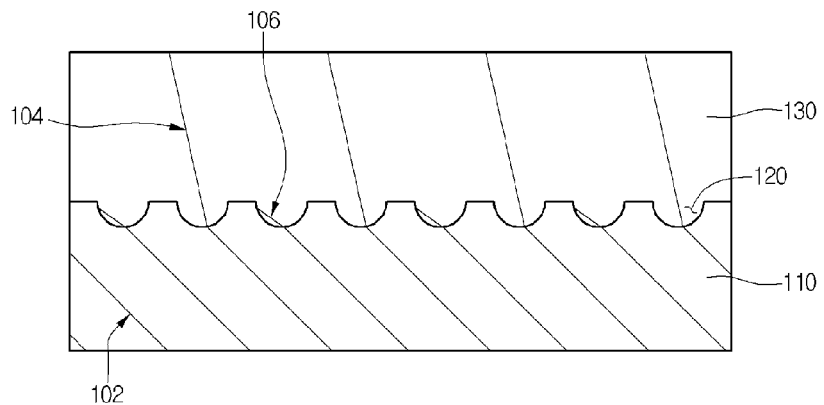
FIG. 10 is a sectional view of a semiconductor device according to a second embodiment.

Hereinafter a semiconductor device according to a second embodiment will be described with reference to FIG. 10. FIG. 10 is a sectional view of a semiconductor device according to a second embodiment.

Referring to FIG. 10, in a semiconductor device 2 according to a second embodiment, an epitaxial layer 130 may be disposed on a base substrate 110 including a pattern groove 120.

The base substrate 110 may be formed of silicon carbide. The silicon carbide has a band gap and thermal conductivity greater than those of silicon. Also, the silicon carbide has carrier mobility similar to that of the silicon and a saturated electron drift velocity and pressure resistance greater than those of the silicon. Thus, the silicon carbide may be applied to a semiconductor device for which high efficiency, high pressure resistance, and high capacity are required.

The pattern groove 120 is defined in the base substrate 110. A defect of the epitaxial layer 130 directly disposed on the base substrate 110 may be significantly reduced through the pattern groove 120.

Specifically, the base substrate 110 formed of the silicon carbide has a basal plane dislocation (BPD) 102. Since the BPD 102 greatly affects reliability of a semiconductor device, it may be important to reduce the BPD 102. According to the related art, to restrict the BPD 102, a buffer layer is further disposed on a base substrate, and an epitaxial layer is disposed on the buffer layer. That is, the buffer layer prevents a crystal defect due to a lattice constant mismatch and thermal expansion coefficient difference between the base substrate and the epitaxial layer from occurring. Thus, it may be necessary to perform an additional patterning process such an etching process or an additional regrowth process to form the buffer layer.

However, in the current embodiment, since the pattern groove 120 restricts the defect between the base substrate 110 and the epitaxial layer 130, the buffer layer may be omitted. Specifically, referring to FIG. 10, the BPD 102 regularly arranged within the base substrate 110 may be converted into a treading edge dislocation (TED) 104 within the epitaxial layer 130 disposed on the pattern groove 120. Here, a portion of the BPD 102 may be expanded and then terminated by meeting the base substrate 110. Thus, the BPD 102 due to the base substrate 110 may be reduced to about 50% or more.

Also, since the additional process for forming the buffer layer is omitted, process costs may be reduced, and quality of a substrate surface may be improved.

The pattern groove 120 may have a depth of about 5 nm to about 10 nm. As described above, when the pattern groove 120 has a depth of about 5 nm or less or a depth of about 10 nm or more, it may be difficult to prevent the dislocation defect of the epitaxial layer 130 disposed on the pattern groove 120 from occurring.

Also, the pattern groove 120 may have a width of about 1 nm to about 10 nm. Also, when the pattern groove 120 has a width of about 1 nm or less or a width of about 10 nm or more, it may be difficult to prevent the above-described dislocation defect from occurring.

Thus, the epitaxial layer may be directly disposed on the base substrate 110 having the pattern groove 120 without providing the buffer layer.

The semiconductor device according to the current embodiment may be applied to all of the vertical-type semiconductor device and the lateral-type semiconductor device to provide a high-quality epitaxial layer, thereby realizing a semiconductor device having high efficiency.

Hereinafter, a method for growing the semiconductor crystal according to the second embodiment will be described in detail with reference to FIGS. 11 to 14. For clear and simplified description, detailed descriptions of the previously described contents will be omitted.

FIGS. 11 to 14 are sectional views for explaining a method for growing a semiconductor crystal according to the second embodiment.

Figure 11:
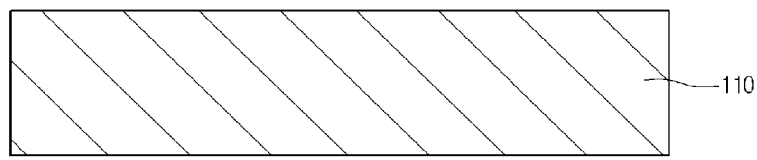
FIGS. 11 to 14 are sectional views for explaining a method for growing a semiconductor crystal according to the second embodiment.
Figure 12:
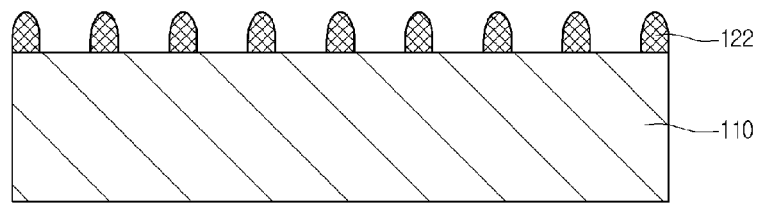

Referring to FIGS. 11 and 12, a silicon carbide substrate 110 is cleaned within a first chamber (not shown). Here, a hydrocarbon gas having 1 to 6 carbon atoms may be provided within a first chamber. For example, the first chamber may have a gas atmosphere containing at least one gas of acetylene, ethane, propane, fluoromethane, ethene, and propene.

When the above-described atmosphere is maintained for about 10 minutes to about 15 minutes, a self-assembled projection 122 is grown on the silicon carbide substrate 110.

The self-assembly represents a phenomenon in which components of molecules voluntarily form a well-ordered structure without artificially manipulating the respective molecules. When the silicon carbide substrate 110 is exposed to a carbon compound gas, the self-assembled projection 122 having a nano scale is grown by reaction of the carbons. The projection 122 may vertically protrude from the silicon carbide substrate 110. For example, the projection 122 may have an elliptical cone shape.

The first chamber may be maintained at a humidity of about 30% or more therein. If the first chamber is maintained under a relatively dry atmosphere having humidity less than that of about 30%, the self-assembled pattern 122 may be scattered.

Also, the first chamber may be maintained at a temperature of about 100° C. to about 300° C. When the first chamber has a temperature of about 100° C. or less, the projection 122 may not be formed. On the other hand, when the first chamber has a temperature of about 300° C. or more, the projection 122 may be scattered in shape.

Figure 13:
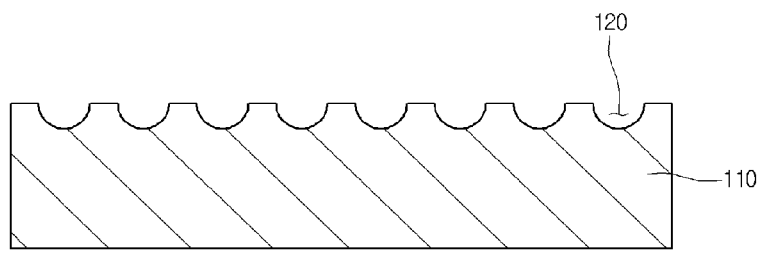

Referring to FIG. 13, a process of forming a pattern groove 120 is performed within a second chamber (not shown).

The process of forming the pattern groove 120 may include a process of etching the silicon carbide substrate 110 using a carrier gas. The carrier gas may include at least one of hydrogen, chlorine, silane, hydrogen chloride, and a hydrocarbon gas having 1 to 6 carbon atoms. For example, the hydrocarbon gas may include acetylene, ethane, propane, fluoromethane, ethene, and propene.

Also, the process of forming the pattern groove 120 may be performed at a temperature of about 1200° C. to about 1500° C. The carrier gas may be decomposed at a temperature of about 1200° C. to generate energy. The generated energy may react with a surface of the silicon carbide substrate 110 to each the surface of the silicon carbide substrate 110. However, the etching of the silicon carbide substrate 110 may do not occur at a temperature of about 1500° C. or more, but the silicon carbide substrate 110 may be grown at the temperature of about 1500° C.

The projection 122 of the silicon carbide substrate 110 may be etched and flat. A portion on which the projection 122 of the silicon carbide substrate is not formed may be more quickly etched to form the pattern groove 120.

The process of forming the pattern groove 120 may be performed for about 5 minutes to about 15 minutes. That is, the process of forming the pattern groove 120 may be performed for about 5 minutes to about 15 minutes to form the pattern groove having a depth of about 5 nm to about 10 nm and a width of about 1 nm to about 10 nm.

Figure 14:
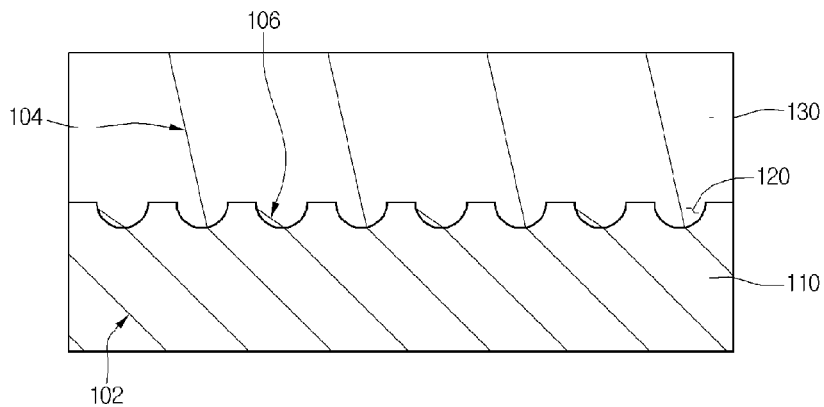

Referring to FIG. 14, an epitaxial layer 130 is formed on the silicon carbide substrate 110 having the pattern groove 120.

At least one gas of hydrogen, chlorine, silane, hydrogen chloride, a hydrocarbon gas having 1 to 6 carbon atoms, methyl trichlorosilane (MTS), trichlorosilane (TCS), and hexamethyldisilane (HMDS) may be further injected into the second chamber to form the epitaxial layer 130. Also, the epitaxial layer 130 may be formed at a temperature of about 1500° C. to about 1700° C.

Although not shown, impurities may be injected into the epitaxial layer 130 form a channel region (not shown).

The epitaxial layer 130 is formed through an epitaxial growth method. The epitaxial growth method is a method in which a new layer is stacked on a single crystal substrate to form a single crystal layer. Here, when the stacked material is equal to the material of the substrate, the epitaxial growth may be called homoepitaxy. In the current embodiment, the epitaxial growth method may be the homoepitaxy method in which the epitaxial layer 130 having the same material as the silicon carbide 110 is formed on the silicon carbide 110 formed of silicon carbide.

That is, since the epitaxial layer 130 is formed of the silicon carbide that is the same material as that of the silicon carbide substrate 110, the quality of the crystal may be improved.

Also, the epitaxial layer 130 may reduce dislocation propagated from the silicon carbide substrate 110 through the pattern groove 120 without additionally forming the buffer layer and significantly reduce a leaking current due to the crystal defect.

Although not shown, a thick film semiconductor growth layer may be further formed on the epitaxial layer 130.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

The invention claimed is:

1. A semiconductor device comprising: a base substrate; patterns on the base substrate; a buffer layer on the base substrate; and an epitaxial layer on the buffer layer; wherein the pattern is patterns are a-self-assembled patterns; and wherein the base substrate, the patterns, the buffer layer, and the epitaxial layer each comprises a same material; wherein the buffer layer is laterally grown between the patterns, wherein the buffer layer is horizontally grown on only the surfaces of the base substrate exposed between the patterns to completely fill the spaces between the patterns, and wherein a height of each of the patterns corresponds to a height of the buffer layer.

2. The semiconductor device according to claim 1, wherein each of the base substrate and the patterns is formed of silicon carbide.

3. The semiconductor device according to claim 1, wherein the patterns vertically protrude from the base substrate.

4. The semiconductor device according to claim 3, wherein the protruding shape of each of the patterns is an elliptical cone shape.

5. The semiconductor device according to claim 4, wherein the elliptical cone shape has a long axis diameter of 10 nm to 30 nm and a height of 100 nm or less.

6. The semiconductor device according to claim 1, wherein the buffer layer is formed of silicon carbide.

7. A method for growing a semiconductor crystal, the method comprising: cleaning a silicon carbide substrate; forming a-self-assembled patterns on the silicon carbide substrate; forming a buffer layer on the silicon carbide substrate by an epitaxy lateral over growth (ELOG) method; and forming an epitaxial layer on the buffer layer; wherein the self-assembled patterns comprise an ordered structure, wherein the buffer layer is laterally grown between the patterns, wherein the buffer layer is horizontally grown on only the surfaces of the silicon carbide substrate exposed between the patterns to completely fill the spaces between the patterns.

8. The method according to claim 7, wherein the cleaning of the silicon carbide and the forming of the patterns are performed under a gas atmosphere containing at least one of carbon compound gases selected from methane, ethane, propane, fluoromethane, and hydrofluorocarbon.

9. The method according to claim 8, wherein the forming of the patterns is performed at a humidity of about 30% or more.

10. The method according to claim 9, wherein the forming of the patterns is maintained for about 20 minutes to about 30 minutes.

11. The method according to claim 7, wherein the forming of the epitaxial layer is performed using an epitaxial growth method, and
wherein the epitaxial layer and the buffer layer each comprises a same material.

12. The method according to claim 11, wherein the forming of the buffer layer and the forming of the epitaxial layer are performed at a temperature of about 1600° C. under a gas atmosphere containing ethane, methane, propane, and a hydrogen gas.

13. A semiconductor device comprising:
a base substrate comprising a pattern groove; and
an epitaxial layer on the base substrate,
wherein the base substrate, the pattern groove, and the epitaxial layer each comprises a same material;
wherein the pattern groove comprises an ordered structure,
wherein the epitaxial layer is directly disposed on the base substrate, and
wherein the pattern groove is filled with the epitaxial layer.

14. The semiconductor device according to claim 13, wherein the pattern groove has a depth of about 5 nm to about 10 nm.

15. The semiconductor device according to claim 13, wherein the pattern groove has a width of about 1 nm to about 10 nm.

16. The semiconductor device according to claim 13, wherein each of the base substrate and the epitaxial layer is formed of silicon carbide.

\* \* \* \* \*